(12) United States Patent
Kim et al.

(10) Patent No.: US 10,290,781 B2
(45) Date of Patent: May 14, 2019

(54) COLOR FILTER AND COLOR FILTER ARRAY PANEL

(71) Applicant: Samsung Display Co., Ltd., Yongin-si (KR)

(72) Inventors: Young Do Kim, Cheonan-si (KR); Jin Ho Ju, Seoul (KR); Min Kang, Seoul (KR); Woo Sub Shim, Asan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 122 days.

(21) Appl. No.: 15/357,000

(22) Filed: Nov. 21, 2016

(65) Prior Publication Data

US 2017/0069807 A1    Mar. 9, 2017

Related U.S. Application Data

(63) Continuation of application No. 13/465,774, filed on May 7, 2012, now Pat. No. 9,505,975.

(30) Foreign Application Priority Data

Oct. 26, 2011    (KR) ........................ 10-2011-0109948

(51) Int. Cl.
*H05B 37/00*    (2006.01)
*H01L 33/58*    (2010.01)
(Continued)

(52) U.S. Cl.
CPC .............. *H01L 33/58* (2013.01); *C09K 11/06* (2013.01); *G02B 5/201* (2013.01); *H01L 27/156* (2013.01);
(Continued)

(58) Field of Classification Search
CPC .............. A61K 2300/00; A61K 38/196; A61K 38/2073; A61K 38/2278
See application file for complete search history.

(56) References Cited

U.S. PATENT DOCUMENTS 7,804,561 B2    9/2010    Sasaki et al.
8,193,031 B2 *  6/2012    Hosoba ............. H01L 21/02554
                                                       438/104
(Continued)

FOREIGN PATENT DOCUMENTS

JP    07-325392    12/1995
JP    08-248217    9/1996
(Continued)

OTHER PUBLICATIONS

An, et al., "Enhanced Emission and Its Switching in Fluorescent Organic Nanoparticles", JACS Articles, Nov. 8, 2002, pp. 14410-14415.
(Continued)

*Primary Examiner* — Sibin Chen
(74) *Attorney, Agent, or Firm* — H.C. Park & Associates, PLC

(57) ABSTRACT

Provided is a color filter array panel. The color filter array panel according to exemplary embodiments of the present invention includes: a substrate; a color filter disposed on the substrate and including a colorant including at least one of a pigment and a dye, and a solid fluorescent material; and a light source unit supplying light to the color filter, in which the solid fluorescent material is an aggregation induced emission enhancement (AIEE) material of which a liquid state is solidified to increase fluorescence efficiency.

11 Claims, 3 Drawing Sheets

(51) Int. Cl.
  *G02B 5/20* (2006.01)
  *C09K 11/06* (2006.01)
  *H05B 33/14* (2006.01)
  *H01L 27/15* (2006.01)
  *H01L 33/50* (2010.01)

(52) U.S. Cl.
  CPC ........... *H01L 33/504* (2013.01); *H05B 33/14* (2013.01); *C09K 2211/1007* (2013.01); *C09K 2211/1025* (2013.01)

(56) References Cited

U.S. PATENT DOCUMENTS

| | | | |
|---|---|---|---|
| 2004/0241560 A1 | 12/2004 | Kawaguchi et al. | |
| 2008/0002112 A1* | 1/2008 | Lee | G02F 1/133617 349/106 |
| 2008/0171271 A1 | 7/2008 | Kim et al. | |
| 2009/0041500 A1 | 2/2009 | Mitsumori et al. | |
| 2010/0009362 A1* | 1/2010 | Tang | G01N 21/6428 435/6.12 |
| 2010/0118530 A1 | 5/2010 | Nagai | |
| 2010/0271578 A1 | 10/2010 | Ohkuma et al. | |
| 2010/0283977 A1* | 11/2010 | Wang | H04N 9/3114 353/84 |
| 2012/0086028 A1* | 4/2012 | Beeson | H01L 33/501 257/98 |

FOREIGN PATENT DOCUMENTS

| | | |
|---|---|---|
| JP | 2004-085592 | 3/2004 |
| JP | 2009-186657 | 8/2009 |
| JP | 2010-243811 | 10/2010 |
| JP | 2011-059673 | 3/2011 |
| KR | 10-1997-0048756 | 7/1997 |
| KR | 10-2007-0042719 | 4/2007 |
| KR | 10-2007-0094679 | 9/2007 |
| KR | 10-2009-0019933 | 2/2009 |
| KR | 10-2009-0073936 | 7/2009 |
| KR | 10-0930668 | 12/2009 |
| KR | 10-2010-0111103 | 10/2010 |
| KR | 10-2011-0024394 | 3/2011 |

OTHER PUBLICATIONS

Non-Final Office Action dated Jul. 8, 2015, in U.S. Appl. No. 13/465,774.
Final Office Action dated Dec. 30, 2015, in U.S. Appl. No. 13/465,774.
Notice of Allowance dated Jul. 28, 2016, in U.S. Appl. No. 13/465,774.
Notification of Reason for Refusal dated Mar. 28, 2018, issued in Korean Patent Application No. 10-2011-0109948.
Lee and Kwak, "Solid-phased Light Emission Increase of Conjugated Molecule/Polymer", Polymer Science and Technology vol. 21, No. 3, Jun. 2010 pp. 251-257, & its English translation.

* cited by examiner

COLOR FILTER AND COLOR FILTER ARRAY PANEL

CROSS-REFERENCE TO RELATED APPLICATION

This application is a Continuation of U.S. patent application Ser. No. 13/465,774 filed on May 7, 2012, which claims priority from and the benefit of Korean Patent Application No. 10-2011-0109948, filed on Oct. 26, 2011, each of which is hereby incorporated by reference for all purposes as if fully set forth herein.

BACKGROUND OF THE INVENTION (a) Field of the Invention

Exemplary embodiments of the present invention relate to a color filter and a color filter array panel.

(b) Discussion of the Background

A liquid crystal display panel which is one of the most common types of flat panel displays currently in use, includes two panels with field generating electrodes such as a pixel electrode and a common electrode and a liquid crystal layer interposed therebetween.

The liquid crystal display generates electric fields in a liquid crystal layer by applying voltage to the field generating electrodes, and determines the direction of liquid crystal molecules of the liquid crystal layer by the generated electric field, thus controlling polarization of incident light so as to display images.

The liquid crystal display further includes a switching element connected to each pixel electrode and a plurality of signal lines such as gate lines and data lines for applying voltage to the pixel electrode by controlling the switching element.

A color filter layer is formed on one of the display panels and the color filter layer includes red, green, and blue color filters according to a color filtering from white light.

Since a material used as the color filter of the liquid crystal display typically absorbs light at a predetermined wavelength band to implement colors, a spectrum irradiated from a backlight may be distorted while passing through the color filters. Also the color filter material may absorb a considerable amount of incident light, reducing total transmittance, and rendering low power consumption difficult to achieve.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide a color filter enabling low power operation and improved transmittance and luminance.

Exemplary embodiments of the present invention also provide a color filter array panel including the color filter enabling low power operation and improved transmittance and luminance.

Additional features of the invention will be set forth in the description which follows, and in part will be apparent from the description, or may be learned by practice of the invention.

An exemplary embodiment of the present invention discloses a color filter array panel including a substrate; a color filter disposed on the substrate and including a colorant including at least one of a pigment and a dye, and a solid fluorescent material; and a light source unit configured to supply light to the color filter. The solid fluorescent material is an aggregation induced emission enhancement (AIEE) material of which a liquid state is solidified to increase fluorescence efficiency.

An exemplary embodiment of the present invention also discloses a color filter including a colorant including at least one of a pigment and a dye; and a solid fluorescent material. The solid fluorescent material is an aggregation induced emission enhancement (AIEE) material of which a liquid state is solidified to increase fluorescence efficiency.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
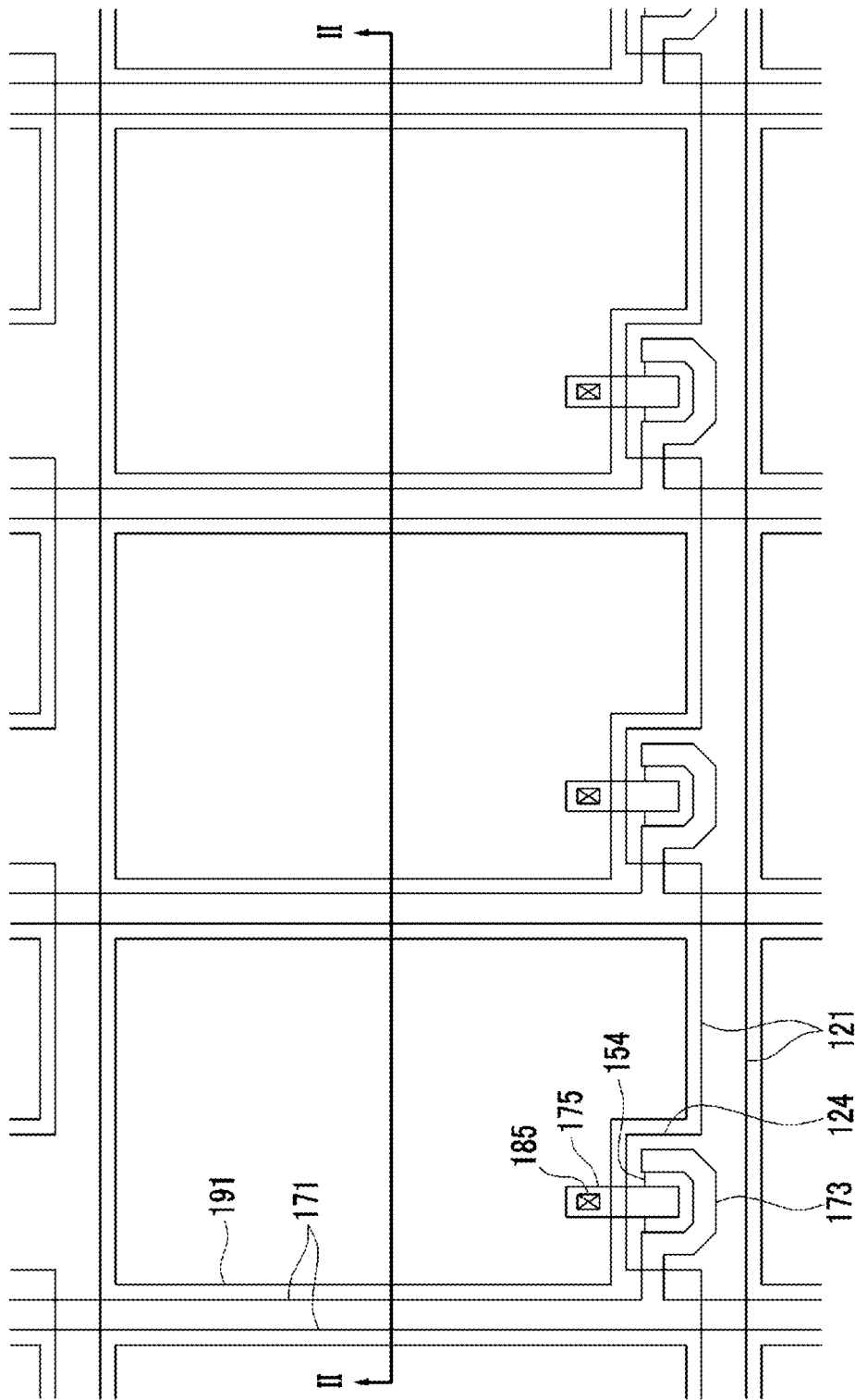
FIG. 1 is a plan view illustrating a liquid crystal display according to an exemplary embodiment of the present invention.

Hereinafter, exemplary embodiments of the present invention will be described in detail with reference to the accompanying drawings. As those skilled in the art would realize, the described embodiments may be modified in various different ways, all without departing from the spirit or scope of the present invention. On the contrary, exemplary embodiments introduced herein are provided to make the disclosed contents thorough and complete and to sufficiently transfer the spirit and scope of the present invention to those skilled in the art.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
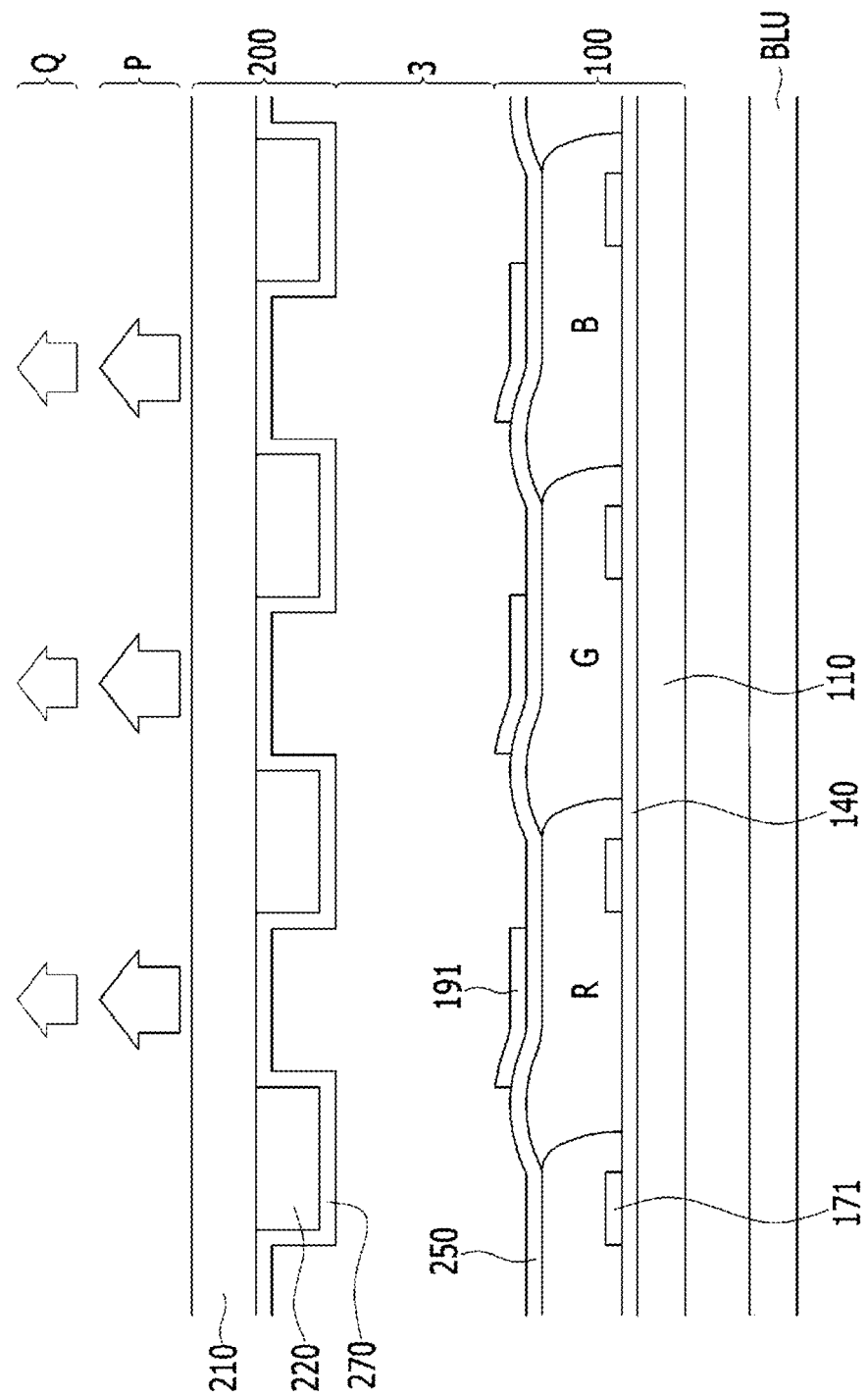
FIG. 2 is a cross-sectional view taken along line II-II of FIG. 1.

FIG. 1 is a plan view illustrating a liquid crystal display according to an exemplary embodiment of the present invention. FIG. 2 is a cross-sectional view taken along line II-II of FIG. 1.

First, a lower panel 100 will be described.

Referring to FIGS. 1 and 2, a plurality of gate lines 121 are formed on a first substrate 110 made of transparent glass, plastic, or the like.

The gate lines transfer gate signals and extend mainly in a horizontal direction. Each gate line 121 includes a plurality of gate electrodes 124 protruding from the gate lines 121.

The gate lines 121 and the gate electrodes 124 may be made of a conductive material such as aluminum-based metal such as aluminum (Al) and an aluminum alloy, silver-based metal such as silver (Ag) and a silver alloy, and copper-based metal such as copper (Cu) and a copper alloy.

In the exemplary embodiment, the gate lines 121 and the gate electrodes 124 are formed by a signal layer, but are not limited thereto and may be formed by a double layer, a triple layer, or the like.

In the double-layer structure, the gate lines 121 and the gate electrodes 124 may be formed by a lower layer and an upper layer and the lower layer may be made of one selected from molybdenum-based metal such as molybdenum (Mo) and a molybdenum alloy, chromium (Cr), a chromium alloy, titanium (Ti), a titanium alloy, tantalum (Ta), a tantalum alloy, manganese (Mn), and a manganese alloy. The upper layer may be made of one metal selected from aluminum-based metal such as aluminum (Al) and an aluminum alloy, silver-based metal such as silver (Ag) and a silver alloy, and copper-based metal such as copper (Cu) and a copper alloy. The triple-layer structure may be formed by combining layers having different physical properties.

A gate insulating layer 140 is formed on the gate line 121.

A plurality of semiconductor layers are formed on the gate insulating layer 140. The semiconductor layers extend mainly in a vertical direction and include a plurality of projections 154 protruding toward the gate electrode 124.

A plurality of data lines 171, which are connected with a plurality of source electrodes 173, and a plurality of drain electrodes 175, are formed on the semiconductor layers.

The data lines 171 transfer data signals and extend mainly in a vertical direction to cross the gate lines 121. Each of the data lines 171 extends toward the gate electrode 124 to be connected with the plurality of source electrodes 173 having a U-lettered shape.

The drain electrode 175 is separated from the data line 171 and extends upwards in the middle of the U-lettered shape of the source electrode 173. The shapes of the source electrode 173 and the drain electrode 175 are one example and may be variously modified.

Data wiring layers 171, 173, and 175 including the data lines 171, the source electrodes 173, and the drain electrodes 175 may be made of a conductive material such as aluminum-based metal such as aluminum (Al) and an aluminum alloy, silver-based metal such as silver (Ag) and a silver alloy, and copper-based metal such as copper (Cu) and a copper alloy.

It is described in the exemplary embodiment that the data lines 171, the source electrodes 173, and the drain electrodes 175 are formed by a signal layer, but the data lines 171, the source electrodes 173, and the drain electrodes 175 are not limited thereto and may be formed by a double layer, a triple layer, or the like.

In the double-layer structure, the data lines 171, the source electrodes 173, and the drain electrodes 175 may be formed by a lower layer and an upper layer, the lower layer may be made of one metal selected from molybdenum-based metal such as molybdenum (Mo) and a molybdenum alloy, chromium (Cr), a chromium alloy, titanium (Ti), a titanium alloy, tantalum (Ta), a tantalum alloy, manganese (Mn), and a manganese alloy, and the upper layer may be made of one metal selected from aluminum-based metal such as aluminum (Al) and an aluminum alloy, silver-based metal such as silver (Ag) and a silver alloy, and copper-based metal such as copper (Cu) and a copper alloy. The triple-layer structure may be formed by combining layers having different physical properties.

An exposed portion which is not covered by the data line 171 and the drain electrode 175 between the source electrode 173 and the drain electrode 175 is disposed at the projection 154 of the semiconductor layer. Except for the exposed portion of the projection 154, the semiconductor layer has substantially the same planar pattern as the data line 171, the source electrode 173, and the drain electrode 175. That is, side walls of the data line 171, the source electrode 173, and the drain electrode 175 may be arranged to be substantially the same as side walls of the semiconductor layer disposed therebelow. The formation of the pattern is because the same mask may be used to form the data wiring layers 171, 173, and 175 including the data line 171, the source electrode 173, and the drain electrode 175 and the semiconductor layer.

A gate electrode 124, a source electrode 173, and a drain electrode 175 form a thin film transistor (TFT) together with a projection 154 of the semiconductor layer 151 and a channel of the thin film transistor is formed at the projection 154 between the source electrode 173 and the drain electrode 175.

Color filters R, G and B are formed on the data line 171, the drain electrode 175, and the exposed projections 154 of the semiconductor layer. The color filters R, G and B may elongate along a column of a pixel electrode 191.

Each of the color filters R, G, and B may display one of primary colors such as red, green, and blue of three primary colors. However, the color filter is not limited to the red, green, and blue of three primary colors and may display one of cyan, magenta, yellow, and white-based colors.

At least one of the color filters R, G and B according to the exemplary embodiment includes a colorant including at least one of a pigment and a dye, and a solid fluorescent material. The color filters R, G and B may be formed by using a patterning or inkjet method after dissolving the colorant, the solid fluorescent material, a dispersant, a binder, a monomer, an initiator, an additive, and the like in an organic solvent.

In an exemplary embodiment, the solid fluorescent material may be added into the colorant including at least one of a pigment and a dye, instead of mixing yellow and violet compensating dyes in a pigment type color filter, a dye type color filter, or a hybrid type color filter. In the exemplary embodiment, the solid fluorescent material is an aggregation induced emission enhancement (AIEE) material of which a liquid state is solidified to increase fluorescence efficiency. The molecular aggregation of the solid fluorescent material according to the exemplary embodiment may occur by various stimuli such as solvent removal, ultraviolet radiation, pressure, heat, and the like.

In general, organic fluorescent dyes have excellent fluorescence efficiency in the liquid state, but fluorescence efficiency thereof rapidly is decreased in the solid state such as a film because a non-radiative process such as excimer formation or energy transition is increased. However, in the solid fluorescent material of the exemplary embodiment, little fluorescence exists in the liquid state, but intensity of the fluorescence is rapidly increased in the solid state, for example, nano particles of a size of about 30 nm to about 40 nm.

In the exemplary embodiment, the solid fluorescent material may include 1-cyano-trans-1,2-bis-(4'-methylbiphenyl) ethylene (CN-MBE), or derivatives thereof. CN-MBE may be represented by the following Formula 1. The derivatives of CN-MBE may be compounds renrecenterl by the Formula 2, Formula 3, and Formula 4.

[Formula 1]

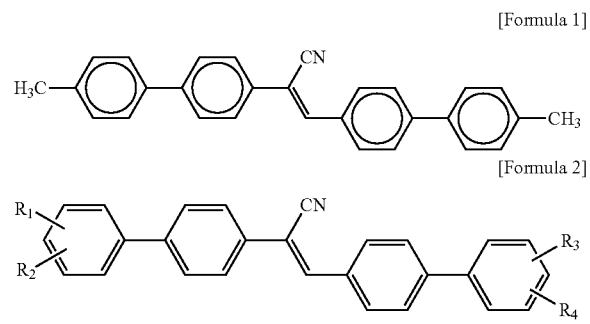

[Formula 2]

In Formula 2, $R_1$, $R_2$, $R_3$, and $R_4$ each independently may be one selected from one group consisting of hydrogen, a methyl group, an ethyl group, a propyl group, a butyl group, a tetrabutyl group, a pentyl group, a hexyl group, $CF_3$, $OCH_3$, $OCH_2CH_3$, halogen, OH, and $NH_2$.

[Formula 3]

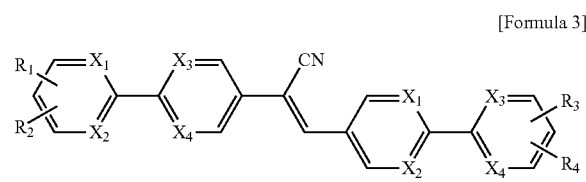

In Formula 3, $R_1$, $R_2$, $R_3$, and $R_4$ each independently may be one selected from one group consisting of hydrogen, a methyl group, an ethyl group, a propyl group, a butyl group, a tetrabutyl group, a pentyl group, a hexyl group, $CF_3$, $OCH_3$, $OCH_2CH_3$, halogen, OH, and $NH_2$.

In Formula 3, $X_1$, $X_2$, $X_3$, and $X_4$ each independently may be one selected from one group consisting of N, O, and S.

[Formula 4]

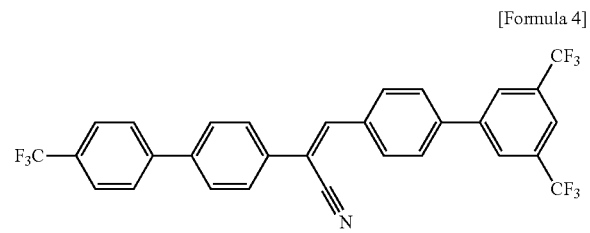 [SMILES: N#C/C(=C\c1ccc(-c2cc(C(F)(F)F)cc(C(F)(F)F)c2)cc1)c1ccc(-c2ccc(C(F)(F)F)cc2)cc1]

The solid fluorescent material according to the exemplary embodiment absorbs light of a short wavelength band such as an ultraviolet wavelength band or a blue wavelength band to emit visible light.

As described above, the color filters R, G, and B are disposed on the lower panel 100, but may be formed to be disposed on the upper panel 200.

According to an exemplary embodiment, a light source unit BLU is disposed below the lower panel 100. The light source unit BLU may irradiate light of about 330 nm to about 700 nm. In order to irradiate the light of about 330 nm to about 700 nm, the light source unit BLU according to the exemplary embodiment includes an edge and a center and a visible light emitting diode and an ultraviolet light emitting diode may be disposed at the edge. The visible light emitting diode generates the light of about 400 nm to 700 nm wavelength and the ultraviolet light emitting diode generates the light of about 330 nm to 400 nm wavelength.

The center of the light source unit BLU may include a light guide plate, a diffuser sheet, a reflective sheet, and the like in order to convert the light generated in the visible light emitting diode and the ultraviolet light emitting diode into a surface light source to supply the surface light source to the lower panel 100.

Unlike the exemplary embodiment described above, the light source unit BLU may include a light emitting diode configured by a red phosphor, a green phosphor, a blue phosphor, and an ultraviolet light emitting chip.

In another exemplary embodiment, the light source unit BLU may include a light emitting diode configured by a yellow phosphor and a blue light emitting chip. Herein, the solid fluorescent material is a material having high sensitivity for short wavelength absorption and an excitable material in the blue wavelength band.

In yet another exemplary embodiment, the light source unit BLU may include a light emitting diode configured by a red phosphor, a green phosphor, and a blue light emitting chip. Herein, the solid fluorescent material is a material having high sensitivity for short wavelength absorption and an excitable material in the blue wavelength band.

In still another exemplary embodiment, the light source unit BLU may include a light emitting diode configured by a red phosphor, a green phosphor, a yellow phosphor, and a blue light emitting chip. Herein, the solid fluorescent material is a material having high sensitivity for short wavelength absorption and an excitable material in the blue wavelength band.

The solid fluorescent material according to the exemplary embodiment absorbs the light of about 330 nm to 700 nm to emit light of about 650 nm wavelength in the red color filter, emit light of about 550 nm wavelength in the green color filter, and emit light of about 450 nm wavelength in the blue color filter.

As shown in FIG. 2, a first light P is emitted outside according to a transmission spectrum of the light generated from the light source unit BLU and a second light Q is emitted outside according to an emission spectrum due to the solid fluorescent material included in the color filters R, G, and B. Accordingly, transmittance and luminance of the display device may be improved.

An overcoat 250 made of an insulating material may be disposed on the color filters R, G and, B. A passivation layer (not shown) may be additionally formed above the overcoat 250. A plurality of pixel electrodes 191 are disposed on the overcoat 250. The pixel electrode 191 is physically and electrically connected with the drain electrode 175 through a contact hole 185 passing through the overcoat 250 and the color filters R, G, and B and receives data voltage from the drain electrode 175.

Hereinafter, an upper panel 200 will be described.

A light blocking member 220 is formed on an insulation substrate 210 made of transparent glass, plastic, or the like. The light blocking member 220 is also referred to as a black matrix and prevents light leakage.

A common electrode 270 is disposed on the light blocking member 220.

A liquid crystal layer 3 is disposed between the upper panel 200 and the lower panel 100.

Figure 3:
FIG. 3 is a photograph for illustrating a characteristic of a solid fluorescent material according to the exemplary embodiment of the present invention.

FIG. 3 is a photograph for illustrating a characteristic of a solid fluorescent material according to an exemplary embodiment of the present invention.

Referring to FIG. 3, the left glass bottle is a Comparative Example of mixing the solid fluorescent material according to the exemplary embodiment with a THF solvent and the right glass bottle is an Experimental Example of mixing the solid fluorescent material according to the exemplary embodiment with a mixed solvent of THF and water. The THF is a solvent in which the solid fluorescent material is dissolved well, whereas the water is a solvent in which the solid fluorescent material is not dissolved well. Accordingly, in the Comparative Example of the left glass bottle, the solid fluorescent material was in a molecular state which is almost dissolved in the THF, such that a fluorescence characteristic was not shown, and in the Experimental Example of the right glass bottle, the solid fluorescent material was not completely dissolved and partially existed in a particle state, such that a blue fluorescence characteristic was shown.

According to an exemplary embodiment of the present invention, it is possible to enable low power of a display device and improve transmittance and luminance by using a color filter including a solid fluorescent material in which fluorescence efficiency increases due to the solidification and a light source unit generating a short wavelength.

While this invention has been described in connection with what is presently considered to be practical exemplary embodiments, it is to be understood that the invention is not limited to the disclosed embodiments, but, on the contrary, is intended to cover various modifications and equivalent arrangements provided they come within the spirit and scope of the appended claims and their equivalents.

What is claimed is:
1. A display device, comprising:
a substrate;
a color filter disposed on the substrate and comprising a solid fluorescent material; and
a light source unit configured to supply light to the color filter,
wherein:
the solid fluorescent material is a solidified aggregation induced emission enhancement (AIEE) material, the AIEE material comprising nano particles of a size of about 30 nm to about 40 nm,
wherein:
the solid fluorescent material comprises at least one selected from the group consisting of a compound represented by the following Formula 1, a compound represented by the following Formula 2, a compound represented by the following Formula 3, a compound represented by the following Formula 4, 1-cyano-trans-1,2-bis-(4'-methylbiphenyl)ethylene, and derivatives thereof:

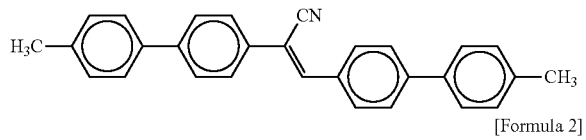

[Formula 1]

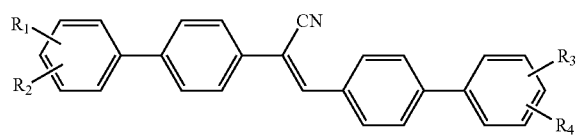

[Formula 2]

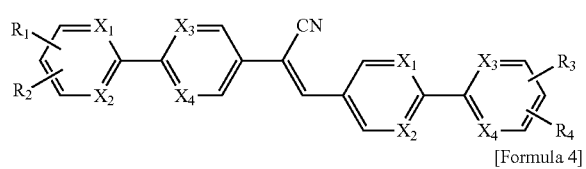

[Formula 3]

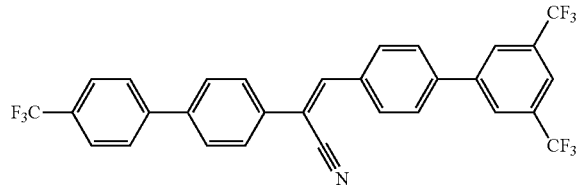

[Formula 4]

wherein in Formula 2, $R_1$, $R_2$, $R_3$, and $R_4$ each independently is one selected from the group consisting of hydrogen, a methyl group, an ethyl group, a propyl group, a butyl group, a tetrabutyl group, a pentyl group, a hexyl group, $CF_3$, $OCH_3$, $OCH_2CH_3$, halogen, OH, and $NH_2$, in Formula 3, $R_1$, $R_2$, $R_3$, and $R_4$ each independently is one selected from the group consisting of hydrogen, a methyl group, an ethyl group, a propyl group, a butyl group, a tetrabutyl group, a pentyl group, a hexyl group, $CF_3$, $OCH_3$, $OCH_2CH_3$, halogen, OH, and $NH_2$, and in Formula 3, $X_1$, $X_2$, $X_3$, and $X_4$ each independently is one selected from the group consisting of N, O, and S.

2. The display device of claim 1, wherein:
the solid fluorescent material absorbs and emits light of an ultraviolet wavelength band or a blue wavelength band.

3. The display device of claim 1, wherein:
the light source unit is configured to supply light having a wavelength of about 330 nm to about 700 nm.

4. The display device of claim 3, wherein:
the light source unit comprises an ultraviolet light emitting diode and a visible light emitting diode.

5. The display device of claim 1, wherein:
the light source unit comprises a red phosphor, a green phosphor, a blue phosphor, and an ultraviolet light emitting chip.

6. The display device of claim 1, wherein:
the light source unit comprises a blue light emitting chip and a yellow phosphor.

7. The display device of claim 1, wherein:
the light source unit comprises a red phosphor, a green phosphor, and a blue light emitting chip.

8. The display device of claim 1, wherein:
the light source unit comprises a red phosphor, a green phosphor, a yellow phosphor, and a blue light emitting chip.

9. The display device of claim 1, further comprising an overcoat disposed on the color filter.

10. The display device of claim 9, further comprising:
a thin film transistor disposed between the substrate and the color filter; and
a pixel electrode disposed on the overcoat,
wherein the pixel electrode is connected to the thin film transistor through a contact hole.

11. The display device of claim 9, further comprising a liquid crystal layer disposed between a lower panel and an upper panel.

* * * * *